United States Patent [19]

Kreiner

[11] Patent Number: 5,001,606
[45] Date of Patent: Mar. 19, 1991

[54] CIRCUIT BOARD PROGRAMMER

[75] Inventor: Thomas C. Kreiner, Phoenix, Ariz.

[73] Assignee: Honeywell Inc., Minneapolis, Minn.

[21] Appl. No.: 406,204

[22] Filed: Sep. 12, 1989

[51] Int. Cl.$^5$ .............................................. H05K 1/14
[52] U.S. Cl. .................................... 361/415; 361/399; 361/429; 211/41
[58] Field of Search ............... 361/415, 391, 399, 429; 211/41

[56] References Cited

U.S. PATENT DOCUMENTS 4,462,499  7/1984  Calabro .......................... 361/399 X
4,470,100  9/1984  Rebaudo et al. ............... 361/415 X Primary Examiner—Leo P. Picard
Assistant Examiner—Paramita Ghosh
Attorney, Agent, or Firm—Howard Paul Terry

[57] ABSTRACT

An in-circuit programming station for a computer and an adapter is provided. This station is used with many printed circuit boards of differing dimensions. This station acts as an interface between a printed circuit board and an in-circuit programming computer. This station also acts to download a program memory into some form of read only memory (ROM) attached to the printed circuit board. The station has an end wall, a platform wall, and an adjustable guide subassembly. The adapter has a connector array. The adjustable guide subassembly has an X-axis and a Y-axis and a Z-axis disposed in quadrature and includes a rail member, first and second adjustable brackets for adjustment parallel to the X-axis, first and second adjustable horizontal members for adjustment parallel to the Y-axis, and first and second adjustable vertical members for adjustment parallel to the Z-axis.

3 Claims, 3 Drawing Sheets

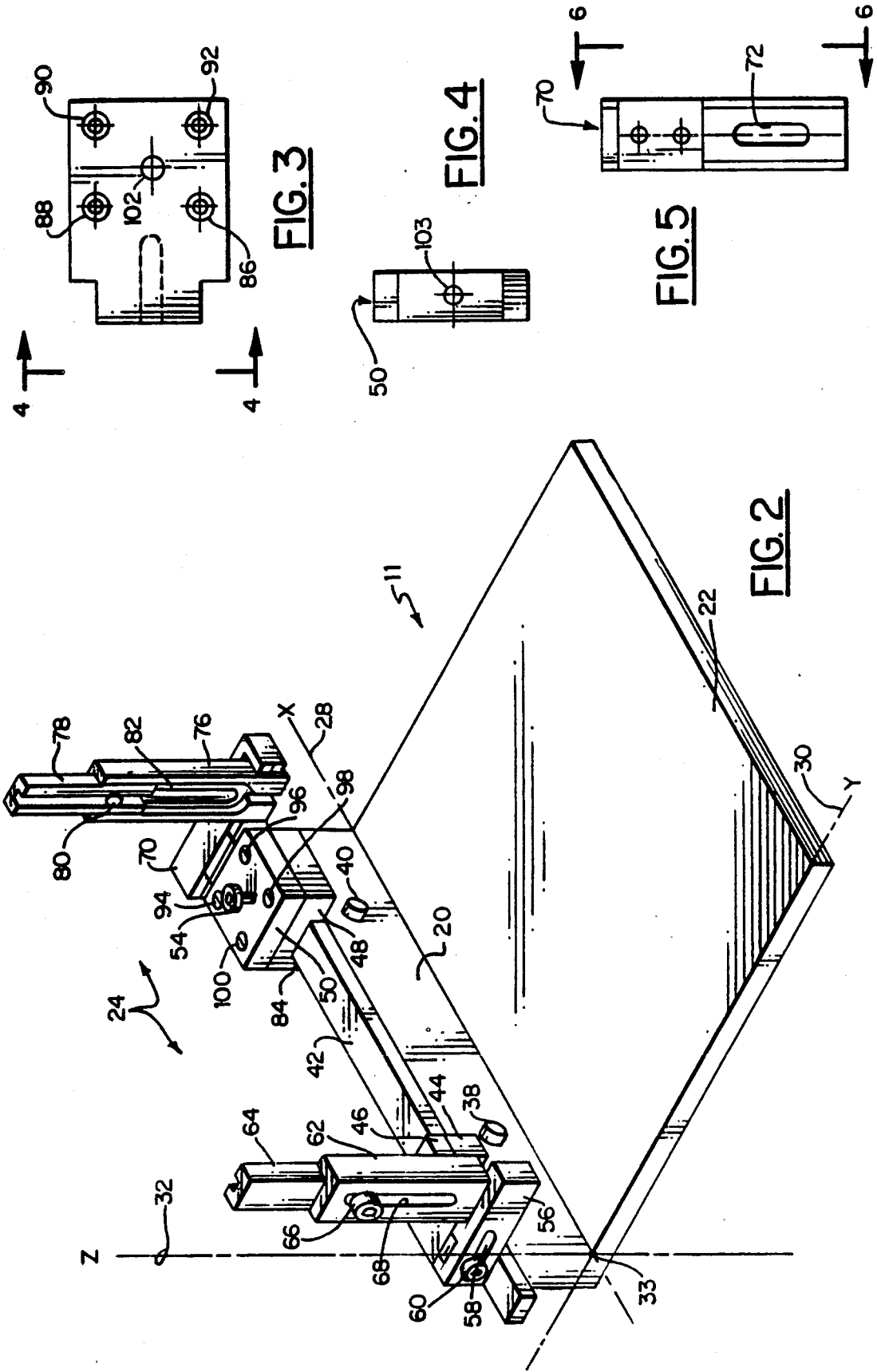

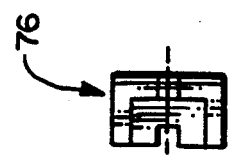
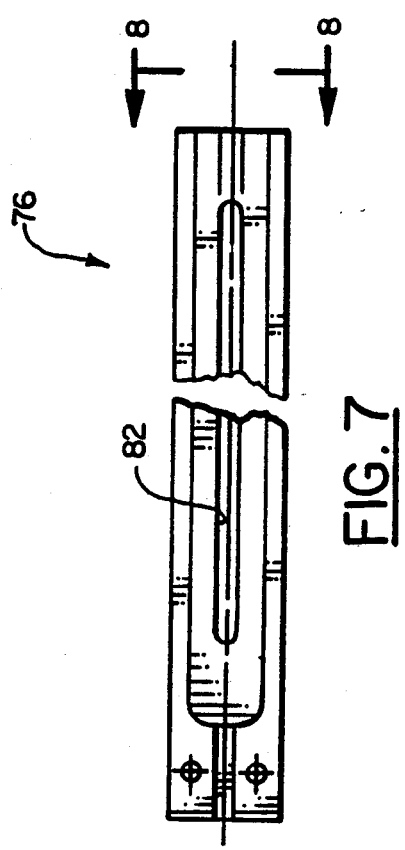
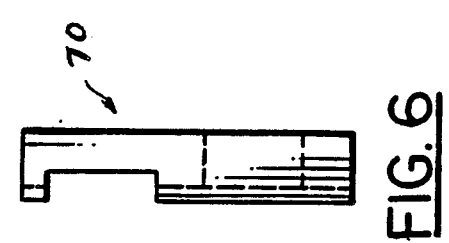
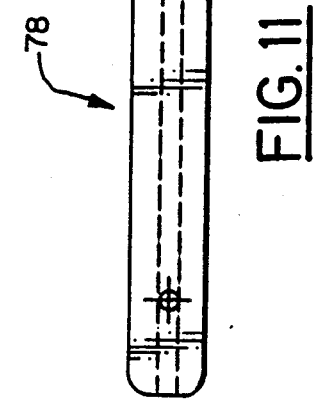
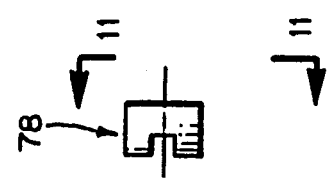
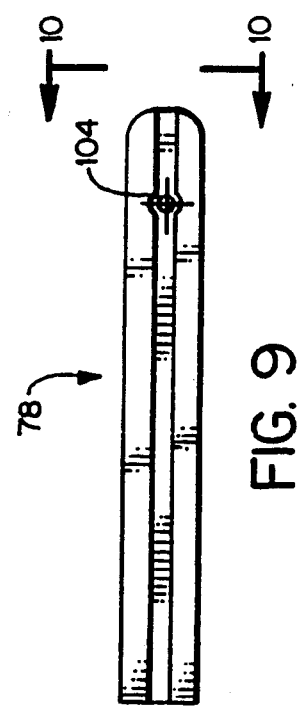

CIRCUIT BOARD PROGRAMMER

The invention relates to a circuit board programmer, and in particular the invention relates to a circuit board programmer having an adjustable board guide.

BACKGROUND OF THE INVENTION

The prior art circuit board programmer includes a computer and an adapter which supports a printed circuit board to be programmed, wherein the adapter has dimensions which are suited to, or the same as, corresponding dimensions of the printed circuit board.

One problem with the prior art circuit board programmer is that each printed circuit board with new selective dimensions requires a new adapter with corresponding suitable dimensions.

SUMMARY OF THE INVENTION

According to the present invention, a circuit board programmer is provided. This programmer comprises a computer and a adapter and a station which supports a printed circuit board (PCB) to be programmed, wherein the station has adjustable card guides for making the dimensions of the station suit the selective dimensions of the printed circuit board. This adjustability allows for proper functioning of the extractors which bear against the card guides whilst extracting the PCB from the high density mating connector located on the adapter.

By using the adjustable card guides, the problem of being required to provide a new station and adapter for each new printed circuit board with selective dimensions is avoided, while maintaining proper extraction.

The following and other objects, features and advantages will be apparent from the following description of the preferred embodiment of the invention as illustrated in the accompanying drawings.

BRIEF DESCRIPTION OF THE DRAWINGS

FIG. 2 is a perspective view of a portion of FIG. 1;

FIG. 3 is a detail view of another portion of FIG. 2;

FIG. 4 is a section view as taken along line 4—4 of FIG. 3;

FIG. 5 is a detail view of another portion of FIG. 2;

FIG. 6 is a section view as taken along line 6—6 of FIG. 5;

FIG. 7 is a detail view of another portion of FIG. 2;

FIG. 8 is a section view as taken along line 8—8 of FIG. 7;

FIG. 9 is a detail view of a portion of FIG. 2;

FIG. 10 is a section view along line 10—10 of FIG. 9; and

FIG. 11 is a section view along line 11—11 of FIG. 10.

DESCRIPTION OF THE PREFERRED EMBODIMENT

Figure 1:
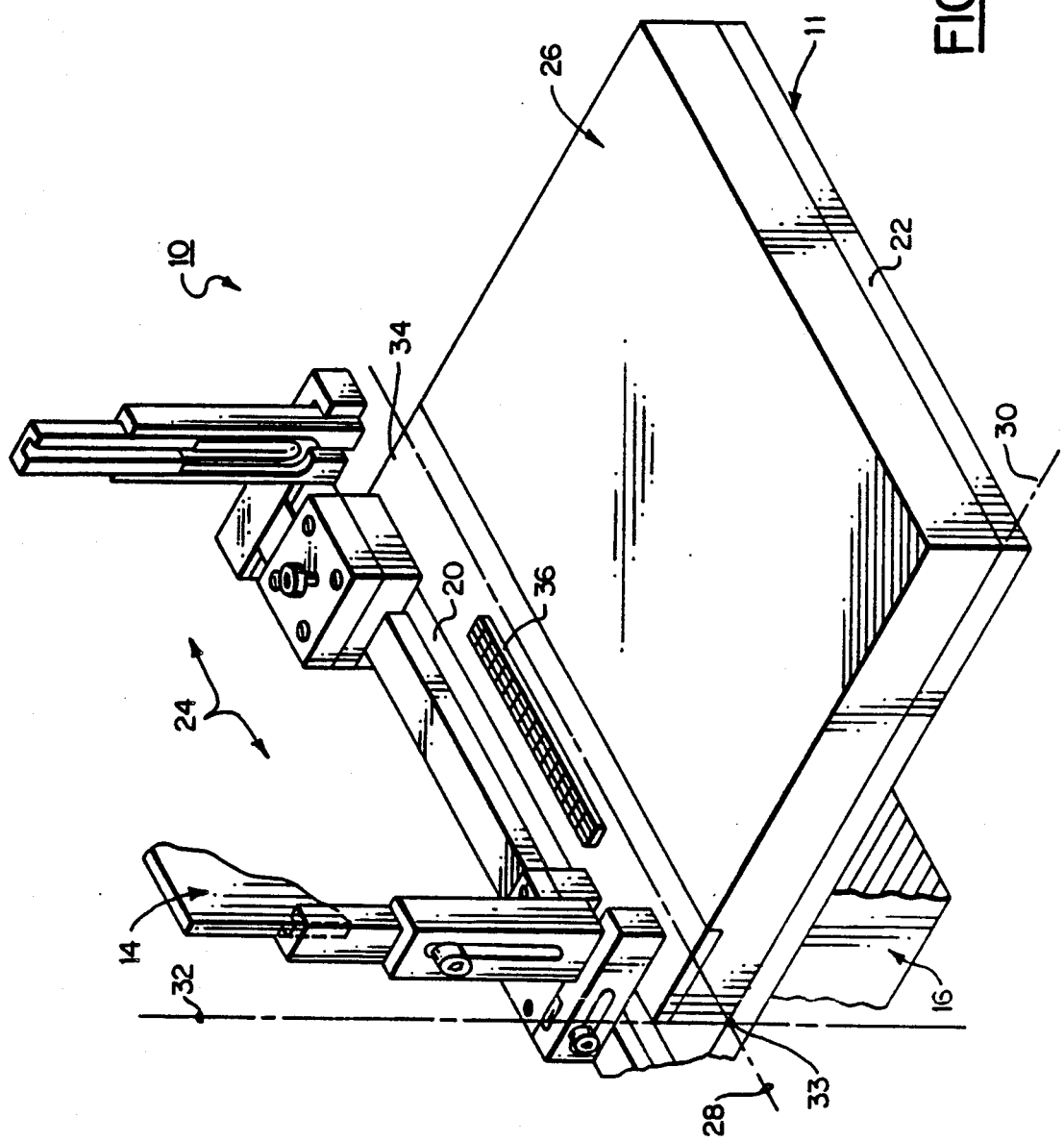
FIG. 1 is a perspective view of a circuit board programmer according to the present invention.

As shown in FIGS. 1 and 2, a circuit board programmer 10 is provided. Programmer or assembly 10 includes a station 11, an adapter 26, a printed circuit board 14 which connects to adapter 26, and a computer 16 which is connected to station 11.

Station 11 has a vertical end wall 20, a horizontal platform wall 22, and an adjustable board guide subassembly or guide 24. Platform wall 22 is fixedly connected to end wall 20. Adapter 26 is supported by platform wall 22. Platform wall 22 has an X-axis 28 and a Y-axis 30 and a Z-axis 32, which intersect at reference point 33. Guide 24 is movable relative to platform wall 22 along each of the three axes 28, 30, 32.

As shown in FIG. 1, adapter 26 has a connector plate 34, which has a connector array 36. End wall 20 has two alignment pins 38, 40, which are received in alignment holes (not shown) in adapter 26, for aligning adapter 26 in a stationary position relative to platform wall 22 and end wall 20.

As shown in FIG. 2, guide 24 is fixedly attached to sliding trucks 44, 48 located on rail member 42, which is fixedly connected to end wall 20. Guide 24 also has a left upper plate 46 and a right upper plate 50. Truck 44 is supported by and is movable relative to rail 42. Plate 46 is fixedly connected to truck 44. Right truck 48 is supported by rail 42 and is movable relative thereto. Right plate 50 is fixedly connected to right truck 48. Left truck 44 and left plate 46 have a left lock screw (not shown), for their adjustment parallel to X-axis 28 relative to rail 42. Right truck 48 and right plate 50 have a right lock screw 54 for their adjustment parallel to X-axis 28 relative to rail 42.

Guide 24 has a left horizontal beam 56, which has a slot 58, that receives a lock screw 60, that is threaded into left upper plate 46 for adjustment of horizontal beam 56 parallel to Y-axis 30. Guide 24 also has a left vertical support post 62, which is fixedly connected to beam 56. Guide 24 also has a left vertical sliding card guide or post 64, which is slidably supported by support post 62. Sliding card guide 64 has a lock screw 66. Support post 62 has a slot 68 for adjustment of sliding card guide 64 parallel to Z-axis 32.

Guide 24 also has a right horizontal beam 70, which has a slot 72 (FIG. 5) that receives a lock screw (not shown) in right upper plate for adjustment parallel to Y-axis 30. Guide 24 also has a right vertical support post 76, which is fixedly connected to right beam 70. Guide 24 also has a right vertical sliding card guide or post 78, which is slidably supported by support post 76. Right sliding card guide 78 has a lock screw 80. Right support post 76 has a slot 82 for adjustment thereof relative to Z-axis 32.

FIGS. 3 and 4 are detail views of right upper plate 50, which is identical to or substantially the same as left upper plate 46, but used opposite hand thereto. Plate 50 has four counterbored holes 86, 88, 90, 92 for respective assembly screws 94, 96, 98, 100 (FIG. 2). Plate 50 has a plain hole 102 for lock screw 54. Hole 103, as shown in FIG. 4, is for the "Y"-axis assembly and locking screw (not shown).

FIGS. 5 and 6 are detail views of right horizontal beam 70, which is identical to or substantially the same as left horizontal beam 56. Right beam 70 shows slot 72.

FIGS. 7 and 8, are detail views of right support post 76, which is substantially the same as left support post 62. Post 76 shows slot 82.

FIGS. 9, 10, and 11 are detail views of right sliding card guide 78, which is substantially the same as left sliding card guide 64. Post 78 shows a hole 104 for lock screw 80.

In operation, programmer 10 provides easy downloading of program memory into some form of read only memory (ROM) attached to the printed circuit board. Guide 24 provides adjustability along three axes 28, 30, 32 to suit the dimensions of a new printed circuit board 14 with selective 10 dimensions. After the printed circuit board 14 is positioned, lock screws 54, 60, 66, 80 are tightened. Connector array 36 is thus connected to the printed circuit board 14 when the board 14 and guide 24 are locked in position. Alignment pins 38, 40 assure that adapter 26 is properly keyed. Pins 38, 40 transmit an insertion force or an extraction force to end wall 20.

The advantages of programmer 10 and station 11 and adapter 26 are indicated hereafter:

A. Station 11 is a universal type of station which can be used with many printed circuit boards of differing dimensions thereby avoiding the need of designing and engineering a new station for each new printed circuit board with new dimensions.

B. Station 11 acts as a connector-to-connector interface between a printed circuit board 14 and an adapter 26 and a computer 16. Station 11 can avoid the need for a newstation which is designed for a new printed circuit board and which has elaborate and expensive machined parts.

C. Programmer 10 can be used for other tasks, besides in-circuit programming, such as production testing, and production verification, where a multiplicity of printed circuit boards of a manufacturing process are checked.

D. Programmer 10 can have many other uses in different parts of a factory, where different types of computers are used.

E. Programmer 10 minimizes the cost of stations and adapters for many printed circuit boards of differing sizes and types. The cost of inventory of stations and adapters is also minimized.

F. Programmer 10 minimizes the time to change over from programming one type of printed circuit board to programming another type of printed circuit board.

G. Station 11 and adapter 26 are easier to fabricate, cost less, and require less shelf space than the prior art units.

H. Programmer 10 resists extraction forces of high density connectors.

While the invention has been described in its preferred embodiment, it is to be understood that the words which have been used are words of description rather than limitation and that changes may be made within the purview of the appended claims without departing from the true scope and spirit of the invention in its broader aspects.

The embodiments of an invention in which an exclusive property or right is claimed are defined as follows:

1. A programmer including:
    a station for accepting a printed circuit board adapter and having an X-axis and a Y-axis and a Z-axis disposed in quadrature; and
    a computer connecting to the station;
    said station comprising:
    an end wall;
    a platform wall fixedly connected to the end wall;
    an adjustable guide subassembly supported by the end wall for supporting the printed circuit board;
    an adapter supported by the platform wall;
    said adapter having a connector array for connection to the printed circuit board;
    wherein the adjustable guide subassembly comprises:
    a rail member supported by the end wall and disposed substantially parallel to the X-axis;
    a first bracket slidably mounted on the rail member at a first end thereof;
    a second bracket slidably mounted on the rail member at an opposite second end thereof, both brackets being adjustable in a parallel manner with respect to the X-axis;
    a first horizontal member adjustably connected to the first bracket for adjustment parallel to the Y-axis;
    a second horizontal member adjustably connected to the second bracket for adjustment parallel to the Y-axis;
    a first vertical member adjustably connected to the first horizontal member for adjustment parallel to the Z-axis; and
    a second vertical member adjustably connected to the second horizontal member for adjustment parallel to the Z-axis.

2. The programmer of claim 1, wherein
    each of the first bracket and second bracket and first horizontal member and second horizontal member and first vertical member and second vertical member has a respective lock means.

3. A programming station for connecting a printed circuit board to a computer comprising:
    an end support means;
    a platform wall fixedly connected to the end support means;
    an adjustable guide subassembly for supporting the printed circuit board and having adjustable board support members for setting dimensions of the printed circuit board support members to suit corresponding dimensions of the printed circuit board; and
    an adapter having a connector array for connection to the printed circuit board and being supported by the platform wall;
    wherein the adjustable guide subassembly has an X-axis and a Y-axis and a Z-axis disposed in quadrature and comprises:
    a rail member supported by the end support means and disposed substantially parallel to the X-axis;
    first and second spaced brackets supported by the rail member and having at least one of said brackets slidable parallel to the X-axis for adjustment thereof;
    first and second horizontal members respectively supported by the first and second brackets and having respective adjusting means for adjusting each of the horizontal members parallel to the Y-axis; and
    first and second vertical members respectively supported by the first and second horizontal members and having respective adjusting means for adjusting each of the vertical members parallel to the Z-axis.

* * * * *